(12) United States Patent
Hofrichter et al.

(10) Patent No.: US 7,976,907 B2
(45) Date of Patent: Jul. 12, 2011

(54) METHOD FOR TRANSFERRING A FUNCTIONAL ORGANIC MOLECULE ONTO A TRANSPARENT SUBSTRATE

(75) Inventors: Alfred Hofrichter, Aachen (DE); Alfred Hans, Roetgen (DE)

(73) Assignee: Saint-Gobain Glass France, Courbevoie (FR)

(*) Notice: Subject to any disclaimer, the term of this patent is extended or adjusted under 35 U.S.C. 154(b) by 914 days.

(21) Appl. No.: 11/574,141

(22) PCT Filed: Aug. 23, 2005

(86) PCT No.: PCT/FR2005/050682
§ 371 (c)(1),
(2), (4) Date: Nov. 9, 2007

(87) PCT Pub. No.: WO2006/024808
PCT Pub. Date: Mar. 9, 2006

(65) Prior Publication Data
US 2008/0187681 A1    Aug. 7, 2008

(30) Foreign Application Priority Data
Aug. 26, 2004 (FR) ..................... 04 51907

(51) Int. Cl.
*H05H 1/24* (2006.01)
(52) U.S. Cl. ...................................... 427/569
(58) Field of Classification Search .................. 427/569
See application file for complete search history.

(56) References Cited

U.S. PATENT DOCUMENTS

| | | | |
|---|---|---|---|
| 4,842,941 A | 6/1989 | Devins et al. | |
| 5,597,624 A * | 1/1997 | Blinov et al. | 427/575 |
| 5,853,817 A * | 12/1998 | Murayama | 427/488 |
| 6,797,336 B2 * | 9/2004 | Garvey et al. | 427/561 |
| 2002/0172938 A1 * | 11/2002 | Cuomo et al. | 435/5 |
| 2003/0050172 A1 * | 3/2003 | Roche et al. | 501/20 |

FOREIGN PATENT DOCUMENTS

| GB | 1 297 972 | * 11/1969 |
| GB | 1 297 972 | 11/1972 |
| GB | 1297972 | * 11/1972 |

* cited by examiner

*Primary Examiner* — Timothy H Meeks
*Assistant Examiner* — Kellym Gambetta
(74) *Attorney, Agent, or Firm* — Oblon, Spivak, McClelland, Maier & Neustadt, L.L.P.

(57) ABSTRACT

This invention relates to
a process for the functionalization of a transparent or translucent substrate by formation of a layer, characterized in that it comprises the stages consisting in
evaporating over the substrate at least one type of organic or organometallic functionalization molecule,
simultaneously with the formation, by plasma-enhanced chemical vapour deposition, of an inorganic glass matrix forming part of the layer;
a substrate made according to this process;
a device for the implementation of this process;
and the applications of this substrate.

6 Claims, 1 Drawing Sheet

Figure 1:
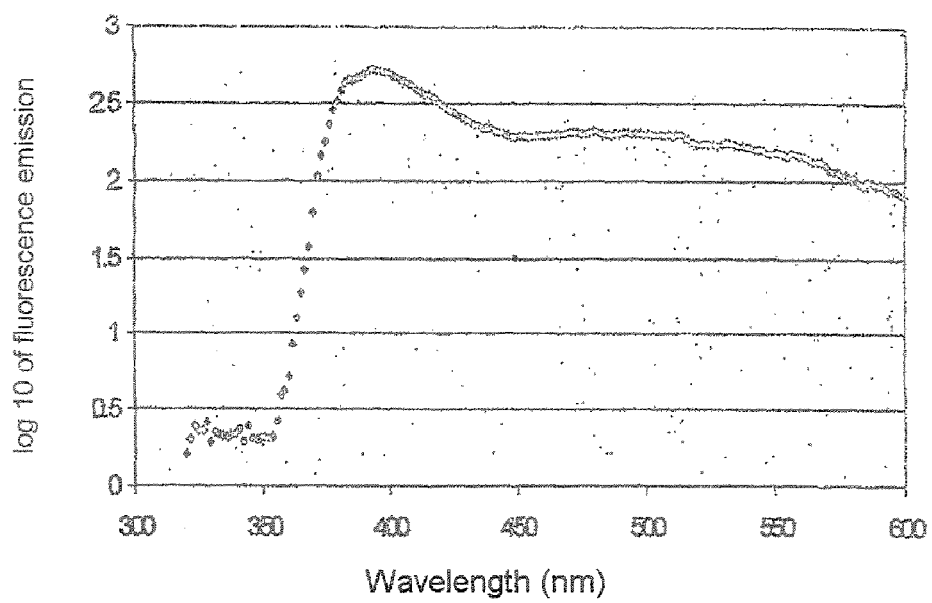

METHOD FOR TRANSFERRING A FUNCTIONAL ORGANIC MOLECULE ONTO A TRANSPARENT SUBSTRATE

The present invention relates to a transparent or translucent substrate, in particular of the type requiring high optical quality: glazing for transport vehicles, buildings, ophthalmic glass, display system screen (television, computer, telephone) roadsign, billboards and the like. The case of the translucent substrate is represented by surface-texturized and/or printed and/or thick plastic or glass substrate applications, in particular diffusing glazing panels/illumination systems, functionalized glazing panels of the electrochromic type, and the like.

The substrate of the invention is a glass such as soda-lime-silica glass or glass with another composition, or a plastic which is transparent: polycarbonate, polypropylene/poly (methyl meth-acrylate), ethylene/vinyl acetate copolymer, poly(ethylene or butylene terephthalate), polyurethane, polyvinylbutyral, cycloolefinic copolymer, that is to say in particular copolymer of ethylene and of norbornene or copolymer of ethylene and of cyclopentadiene, ionomer resin (ethylene/(meth)acrylic acid copolymer neutralized by polyamine, and the like), unsaturated polyester, ethylene/vinyl acetate copolymer, and the like.

The invention is targeted in particular at making available a transparent substrate comprising a layer which provides it, on a lasting basis, with varied functions, in isolation or in combination, to a degree adjustable, controllable, while retaining most of the original transparency and optical quality.

As these functions are given, in the context of the invention by essentially organic or organometallic molecules, the inventors have sought to transfer these molecules onto the substrate in effective amounts.

Various means are known: evaporating, spraying, painting, and the like.

Protection of the layer is necessary against, for example, heat, moisture, mechanical attacks (scratches, and the like), chemical attacks, the presence of oxygen, the presence of UV radiation, and the like.

Moreover, protective layers for the substrate itself, in particular with regard to UV radiation or mechanical attacks, often also prove to be necessary, in particular when the substrate is a polymer, such as polycarbonate.

Known protective layers are, for example, hard and thermally stable inorganic glasses, for example consisting of oxides and/or nitrides, among which may be mentioned $SiO_2$, $TiO_2$, and the like.

These inorganic glass layers can be prepared by various techniques: lacquers, sol-gel, plasma-enhanced chemical vapour deposition (PECVD), the latter being particularly favourable in that it makes possible the preparation of hard and dense layers, on the one hand, and of multilayers, on the other hand. The lacquer and sol-gel techniques are not devoid of problems: poor resistance to the diffusion of oxygen or of water, poor mechanical strength, difficulty in preparing multilayers and thus in combining different corresponding functionalities.

Furthermore, organic molecules decompose at a relatively low temperature and require particularly mild transfer conditions.

Moreover, it is obviously advisable to transfer them in such a way that their transfer product provides the product obtained with the desired function.

Finally, it is necessary to establish the conditions of durability of the new function.

To this end, a subject-matter of the invention is a process for the functionalization of a transparent or translucent substrate by formation of a layer which is distinguished in that it comprises the stages consisting in:
  evaporating over the substrate at least one type of organic or organometallic functionalization molecule,
  simultaneously with the formation, by plasma-enhanced chemical vapour deposition, of an inorganic glass matrix forming part of the layer.

An organic molecule comprises here C, H, O, N, S, P, halogen atoms; an organometallic molecule additionally comprises metal atoms, such as Al, Ti, Mg, Si, and the like. It is capable of exhibiting all types of bonds usual in organic molecules, in particular $sp^3$ carbon-carbon single bonds, carbon-carbon double bonds, benzene rings, and the like.

It is important for the vapour pressure of the functionalization molecule or molecules at the evaporation temperature to be sufficiently high for a sufficient flow to be obtained over the substrate at the pressure at which the deposition is carried out. Typically, these vapour pressures vary between 1 and 1000 Pa depending on the molecule. An increase in this vapour pressure can result from the substitution of certain atoms or groups (H or $CH_3$) of the organic molecule by F atoms, for example.

In addition, the molecule can be modified or transformed for the purpose of incorporating therein bonds or groups which make it possible to promote the grafting thereof in the matrix.

The matrix consists of an inorganic glass according to the above definition. An example thereof is an "$SiO_x$ matrix", which is understood to mean a network of crosslinked chains composed essentially of Si and O atoms but also of smaller proportions of C, H or N atoms, for example.

This matrix is formed by a plasma-enhanced chemical vapour deposition (PECVD) gaseous silicon-comprising precursors, such as hexamethyldisiloxane (HMDSO), tetramethyldisiloxane (TMDSO), tetraethoxysilane (TEOS) or tetramethoxysilane (TMOS), are protected over the substrate under an argon-oxygen plasma, for example. The precursors are thus polymer zed/crosslinked.

The inventors realized that the condensation of vapour of varied organic and/or organometallic molecules on the substrate, during plasma polymerization of the inorganic glass matrix, made it possible to incorporate, in the latter, derivatives of these organic and/or organometallic molecules capable of providing various functions, under excellent conditions of protection by the matrix and thus of durability.

The process of the invention makes possible the ready incorporation of various functionalities due to the ease of control of the flows which is inherent to it. It makes possible in particular the mixing of different functional molecules (for example, different colours) in the same layer, in optional combination with stabilizers for one or more functional molecules or for the matrix.

The process of the invention also facilitates the preparation of stacks of different layers, in particular:
  one or more "pure" matrix layers having the function of barrier to oxygen, of barrier to water or of protecting against the diffusion of various chemical compounds,
  adhesion layer,
  finishing layer: hydrophobic, hydrophilic; slipping (low coefficient of friction),
  gradual transition layer (gradient layer),
  mechanical protection layer, and the like.

Furthermore, the compatibility of these molecules with the matrix makes it possible to obtain perfect transparency and optical quality.

As regards the nature of these molecules once incorporated in the matrix, it is probable that simple grafting products of the starting molecules in the more or less separate state are concerned; the properties of the starting molecules are retained and are transferred into the matrix.

The operating conditions of flow rate, pressure, temperatures, characteristics of the plasma and nature of the organic/organometallic molecules could be chosen in order for sufficient amounts of the molecules to be incorporated in the matrix in order to functionalize it to the desired degree.

For a given molecule, the vapour pressure can be modified by varying the evaporation temperature, it being known that some molecules decompose from a given temperature, which should therefore not be exceeded. Likewise, the flow at a given temperature depends on the geometry of the injection system and on the surface area of the evaporator.

In the process of the invention, it is often the case that a proportion, generally a low proportion, of the organic or organometallic molecules introduced at the start is not finally incorporated in the final substrate provided with its layer. If the transfer of the molecules into the layer is not 100%, it is important simply that it be sufficient. Likewise, if a portion of the molecules are modified during the transfer, it is important that a sufficient number of molecules carrying the functionality be incorporated.

The temperature of the substrate is a parameter of the process of the invention which makes it possible to vary the haze of the product obtained. This temperature is just as easily greater than as less than the melting point of the organic or organometallic molecule or molecules incorporated. When a weak haze is desired, which is generally the case with glazings, the temperature of the substrate during the deposition has to be sufficiently high.

On the other hand, it is advisable to prevent the temperature of the substrate from reaching, during the deposition, excessively high values capable of limiting the amount of molecules grafted up to eliminating them altogether.

In a preferred implementation of the invention, the vapour of each organic/organometallic molecule is heated, between the creation thereof and the coming into contact thereof with the substrate, so that its temperature increases when it is moving, in metal pipes in particular. This measure facilitates the desired circulation of the vapour.

Another subject-matter of the invention is a transparent substrate comprising a functional layer prepared according to the process described above, in which the function provided by an organic or organometallic molecule is a function of colouring, reflection of visible light which can vary with the angle, electrical conductivity, infrared absorption or reflection, US absorption or reflection, photochromism, thermochromism, electrochromism, electroluminescence, phosphorescence, fluorescence, antibacterial action, photocatalytic action, fungicidal action, odour absorbing or emitting, resisting tobacco smoke, hydrophilicity or hydrophobicity.

Advantageously, the functional layer comprises at least one agent for protecting the organic or organometallic molecule or molecules, such as an ultraviolet absorber or an antioxidant.

Examples of organic or organometallic molecules are naphthalene, anthracene, pyrene, anthraquinone and their derivatives. Mention may be made, as representatives of the latter, of:
1,4-d-(butylamino)anthraquinone,
1,2-dihydroxyanthraquinone,
1,5-dihydroxyanthraquinone,
1,8-dihydroxyanthraquinone.

Mention may additionally be made of:
the family of the azo dyes, that of the perylenes and that of the phthalocyanine dyes;
the dyes used for coloured lasers, such as, for example, the family of the polyphenyls or the family of the phenyloxazoles (for example, the dyes produced by Lambdachrome—LC 3300, 3400, 3500, 359, 3600, 3640, 3650, 3690, 3700, 4230, 3690, 3930, 3590, 3720, and the like);
the molecules used as dyes for medical, biological or industrial applications, such as for dyeing the hair, tissues (indanthrene), polymers, and the like, and more generally any molecule having colouring properties and a vapour pressure compatible with the process of the invention;
molecules known to act as precursors for conducting polymers, for example N-allyl-N-methylaniline (CAS 6628-0-7-5), poly(3-hexylthiophene-2,5-diyl) (CAS 104934-50-1), phenyl vinyl sulphoxide (CAS 20451-53-0) or p-xylylenebis(tetrahydro-thiophenium) chloride (CAS 52547-07-6);
as photochromic molecules, the family of the spirobenzopyrans, of the furylfulgides and of the diarylethenes;
as thermochromic molecules, variously substituted derivatives of the rylenes (Stefan Becker, Monomere und polymere Rylenfarbstoffe als funktionelle Materialien [Monomeric and polymeric rylene colorants as functional materials], Thesis, Mainz, 2000), in particular the compounds with the following expanded formula, with the various R substituents below.

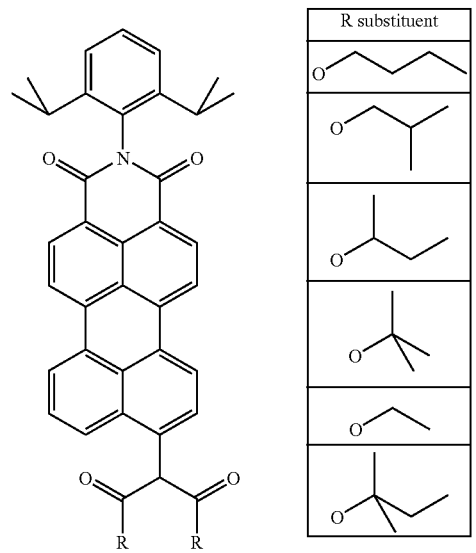

molecules known for the manufacture of organic LEDs (light emitting devices);
transition metal complexes, such as ruthenium tris(bipyridine).

Mention may be made, as additives and stabilizers, of the stabilizers and antioxidants commonly used for polymers, in particular benzophenones, benzotriazoles, cyanoacrylates, oxanilides, triazines or phenyl salicylates. These molecules exist under various registered trademarks according to the manufacturers:
Ciba-Geigy: Tinuvin-123, -144, -213, -234, -312, -326, -327, -328, -360, -571, -622, -765, -770, -1577, -P; Chimassorb-81, Irganox-245, -1010, -1076, -1098, -1135, -1141, -5057, Uvitex OB;

Cytec: Cyasorb UV-9, -24, -81, -90, -531, -1164, -2908, -3638, -3853, -3853S, -5411; Cyanox 425;

BASF: Uvinul-3000, -3030, -3040, -3049, -3050, -3035, -MBC 95; -D 50, -MBM, -A Plus, -N 539 T, -MC 80.

Moreover, mention may be made of molecules comprising aluminium, such as aluminium alkoxide, aluminium isopropoxide, aluminium β-diketonate, β-diketonato)-alkoxyaluminate, aluminium acetylacetate or aluminium 2,4-pentanedionate.

According to an advantageous characteristic made possible by the process of the invention, the substrate obtained is transparent and has a haze at most equal to 2%.

Moreover, a subject-matter of the invention is a device for the implementation of the process described above, comprising for each organic or organometallic molecule, means for evaporating and for dispensing the vapour produced comprising an injection grid composed of nozzles uniformly distributed over the surface of the substrate, means for dispensing at least one precursor of the inorganic glass matrix comprising a specific injection grid, and a plasma source.

The latter is advantageously offset, that is to say that the plasma is emitted at a certain distance from the substrate, towards which it is projected while passing through the flows of precursor of the matrix and of organic/organometallic molecules, for their part confined close to the substrate.

Another subject-matter of the invention is the application of the substrate defined above to a glazing for land, sea or air transport vehicles, for buildings, to interior decoration, to an aquarium, domestic electrical appliances, to street furniture, bus shelters, billboards, notice boards, to an illumination system, in particular covers for the lights, including headlights, of transport vehicles, a greenhouse, a mirror, a rear-view mirror, a display system screen of the computer, television or telephone type, an electrically controllable glazing, such as an electrochromic glazing, a liquid crystal glazing or an electroluminescent glazing, or a photovoltaic glazing.

The invention is illustrated by the examples which follow.

EXAMPLE 1

Use is made of a deposition chamber equipped with a large-size (350×900 mm) microwave plasma source composed of several individual microwave antennae operating in post-discharge mode with a total maximum power of 16 kW at a frequency of 2.45 GHz. The gases necessary for the deposition process (oxygen, argon and hexamethyldisiloxane) are introduced into the chamber through bulk flow control devices and metal pipes heated to 45° C.

The organic/organometallic molecule or molecules is/are stored in (an) evaporators) (metal canisters) and introduced into the chamber via metal pipes arranged in (a) tree structure(s) through electropneumatic valves heated according to the molecule. Thus, it is guaranteed that the vapour of these molecules has a temperature which is constantly increasing as it moves through the pipes, which movement is found to be facilitated thereby.

The injection grid for the organic molecule and that for the hexamethyldisiloxane (HMDSO) are in the immediate proximity of the substrate (polycarbonate glazing) and are cited by order of distance from the latter. It would also be possible to envisage fitting them into one another at an equal distance from the substrate.

The pressure in the chamber during the deposition is 2 Pas usually between 1 and 10 Pa.

The organic molecule is 1,4-di(butylamino)anthraquinone (CAS 17354-142).

The duration of deposition of the various constituents, the argon, oxygen and HMDSO flow rates in sccm (standard cubic centimetre per minute) and the microwave power (kW) are specified in the table below.

TABLE

| Stage | Time (s) | Valve Organic molecule | Argon flow rate (sccm) | O$_2$ flow rate (sccm) | HMDSO flow rate (sccm) | MW power (kW) |
|---|---|---|---|---|---|---|
| Organic layer | 125 | Open | | 2848 | 625 | 11 |
| Protective layer | 125 | Closed | | 2849 | 625 | 11 |

The substrate is heated to and maintained at 95° C. during the deposition, the melting point of 1,4-di(butylamino) anthraquinone being 120-122° C.

Several tests are carried out by varying the temperature of the 1,4-di(butylamino)anthraquinone in the evaporator from 184° C. to 219° C. Within this temperature range, the vapour pressure of this molecule varies between 1 and 15 Pa, which corresponds, with the given injection and evaporation system, to a flow varying approximately between 0.1 and 5 sccm.

Between these two temperatures, the light transmission with a wavelength of 595 nm decreases from 87 to 66%. In other words, the deposited layer gives a blue colouring to the glazing which becomes more pronounced as the temperature of the evaporator increases.

The haze of this glazing is at most 0.25%.

EXAMPLE 2

The 1,4-di(butylamino)anthraquinone molecule is replaced by pyrene (CAS 129-00-0). This molecule has an absorption peak at approximately 325 nm in solution in cyclohexane and a fluorescence peak (excitation wavelength 317 nm) at approximately 400 nm.

Pyrene has a vapour pressure of approximately 100 Pa at 175° C. (deposited material L5), of 200 Pa at 190° C. (deposited material L4) and of approximately 300 Pa at 200° C. (deposited material L3), which corresponds, with the given injection and evaporation system, to a flow of approximately 150, 500 and 1250 sccm respectively.

The optical density of the three substrates provided with their layer is measured with respect to that of a substrate provided with a layer devoid of organic molecule. A peak in the vicinity of 330 nm is observed, the intensity of which increases with the flow of the molecule, indicating an increasing amount of organic molecule incorporated in the layer.

FIG. 1 shows a fluorescence spectrum of the layer of the deposited material L4 at an excitation wavelength of 317 nm. The fluorescence emission is expressed on a decimal logarithmic scale as a function of the wavelength (nm). A peak centred around 400 nm is observed, showing that the substrate with the molecule has fluorescent properties.

EXAMPLE 3

Example 1 is repeated while inserting, between the deposition of the organic layer and that of the protective layer (see table), a stage of incorporation of pyrene according to the preceding example.

The resulting layer has a green colouring.

EXAMPLE 4

Example 1 is repeated while replacing, in the evaporator, 1,4-di(butylamino)anthraquinone by 2-(2H-benzotriazol-2-yl)-4,6-bis(1,1-dimethylpropyl)phenol, sold by Ciba-Geigy under the registered trademark Tinuvin 328.

Figure 2:
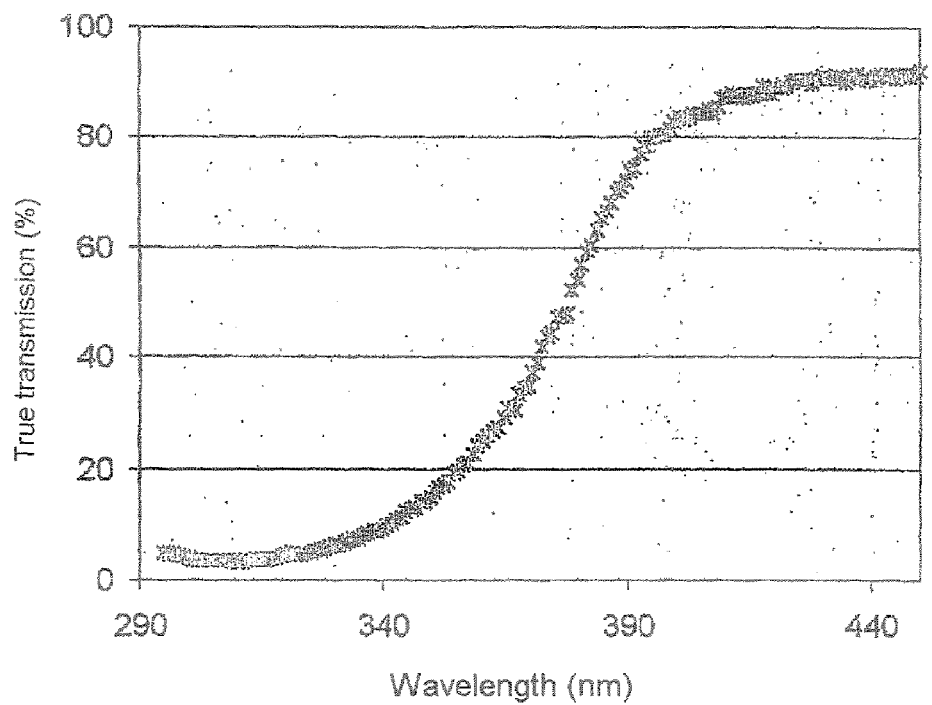

The evaporator is at a temperature of 213° C. FIG. 2 shows the true transmission (that is to say, with subtraction of that of the layer devoid of organic molecule), expressed as %, as a function of the wavelength in nm. It is found that a functionality of absorption of UV radiation is indeed bestowed on the layer by the molecule.

EXAMPLE 5

Example 1 is repeated while varying the temperature of the substrate. The haze is measured in each test

| Temperature of the substrate [° C.] | Haze [%] |
| --- | --- |
| 25 | 10 |
| 65 | 0.76 |
| 75 | 0.48 |
| 95 | 0.22 |

The haze can thus be controlled as a function of the temperature of the substrate during the deposition.

The invention claimed is:

1. A process for functionalizing a transparent or translucent substrate comprising forming a layer on the substrate, wherein:
    the layer is formed by:
        evaporating a composition comprising at least one organic or organometallic compound to obtain a vapor;
        dispensing the vapor over the substrate; and
        depositing an inorganic glass on the substrate by plasma-enhanced chemical vapor deposition;
    the inorganic glass is deposited on the transparent or translucent substrate in the presence of the vapor;
    the layer comprises functional molecules derived from the composition comprising the at least one organic or organometallic compound dispersed in a matrix of the inorganic glass;
    the functional molecules exhibit at least one function selected from the group consisting of coloring, reflection of visible light that varies with angle, electrical conductivity, infrared absorption or reflection, UV absorption or reflection, photochromism, thermochromism, electrochromism, electroluminescence, phosphorescence, fluorescence, antibacterial action, photocatalytic action, fungicidal action, odor absorbing or emitting, resisting tobacco smoke, hydrophilicity and hydrophobicity; and
    the at least one organic or organometallic compound comprises a compound selected from the group consisting of naphthalene, anthracene, pyrene, anthraquinone and derivatives thereof.

2. The process according to claim 1, further comprising heating the vapor before dispensing the vapor over the substrate.

3. The process according to claim 1, wherein depositing an inorganic glass comprises employing a gaseous silicon-comprising precursor selected from the group consisting of hexamethyldisiloxane (HMDSO), tetramethyldisiloxane (TMDSO), tetraethoxysilane (TEOS) and tetramethoxysilane (TMOS).

4. The process according to claim 1, wherein depositing an inorganic glass comprises employing oxygen, argon and hexadimethyldisiloxane gases.

5. The process according to claim 1, wherein the matrix of the inorganic glass is an $SiO_x$ matrix.

6. The process according to claim 1, wherein the at least one organic or organometallic compound comprises a compound selected from the group consisting of 1,4-di(butylamino)anthraquinone and pyrene.

* * * * *